United States Patent [19]
Burnsweig

[11] 3,771,062
[45] Nov. 6, 1973

[54] ELECTRONICALLY CONTROLLABLE TIME DELAY CIRCUITS

[75] Inventor: Joseph Burnsweig, Los Angeles, Calif.

[73] Assignee: Hughes Aircraft Company, Culver City, Calif.

[22] Filed: Mar. 2, 1972

[21] Appl. No.: 231,192

[52] U.S. Cl. .................... 328/55, 307/293, 307/295
[51] Int. Cl. .................... H03k 5/159
[58] Field of Search .................... 328/55, 56; 307/293, 307/295

[56] References Cited

UNITED STATES PATENTS 2,800,580 7/1957 Davies .................... 328/56 X
3,185,942 5/1965 White .................... 328/55 X
3,202,769 8/1965 Coleman .................... 328/55 X

*Primary Examiner*—John S. Heyman
*Attorney*—W. H. MacAllister, Jr. et al.

[57] ABSTRACT

Time delay devices disclosed herein include first and second dispersive delay lines intercoupled to provide "flat" time delay of signals processed therethrough; with the value of the time delay being selectable by means for controlling the carrier frequency of the signals. In one disclosed embodiment a time delay controller circuit, incorporating an electronically variable time delay device mechanized in a feedback control loop arrangement, provides a reduction in time jitter between successive signal groups; and another embodiment utilizes a variable time delay device in a precision large deviation, wide bandwidth phase modulator configuration.

19 Claims, 17 Drawing Figures

ELECTRONICALLY CONTROLLABLE TIME DELAY CIRCUITS

BACKGROUND OF THE INVENTION

This invention relates generally to variable time delay devices; and more particularly to wide bandwidth electronically controllable time delay circuits, controllers, and modulators.

Prior art electronically controllable time delay techniques have generally employed low bandwidth video delay lines using inductors and varactors; bridge tee type intermediate frequency phase modulators with varactors; intermediate frequency glass delay lines; or integrated metal oxide silicon (MOS) and bipolar analog lines using "bucket brigade capacitors." Although acceptable for many applications, these prior art techniques have been severely limited as to the magnitude of the time delay control range, the degree of linearity, the operating frequency range and/or the bandwidth.

For example, in certain video tape systems time jitter introduced by the signal processing must be reduced to obtain acceptable picture quality. Prior art electronically variable time delay devices have generally been functionally too restrictive or economically unacceptable for use in time base correction circuits for these video tape systems, as well as other signal processing applications.

Another example relates to radar systems of the type wherein the transmitted signal is frequency encoded to avoid the range ambiguity problem associated with high PRF (pulse repetition frequency) operation. In this type of radar system it is desirable to produce a signal that varies in frequency precisely in accordance with a selected program; and not only are applicable prior art phase modulator arrangements extremely costly but their limited performance have proven to be only marginally acceptable.

SUMMARY OF THE INVENTION

It is therefore a primary object of the subject invention to provide a device capable of producing electronically controllable wide bandwidth, flat time delay. As used herein the term "flat time delay" implies phase shift which is a linear function of frequency.

Another object is to provide electronically variable time delay devices which possess a relatively large time delay control range; and a large bandwidth over an extended range of operating (carrier) frequencies.

A further object is to provide an improved electronically variable time delay device which allows continuous analog, digital or a combination thereof, control of the transit time of signals processed therethrough; in which the bandwidth as well as the time delay may be electronically controlled; and wherein preselected values for the mean time delay may be readily implemented.

Still another object is to provide a cost effective time delay controller useful for reducing time jitter between successive signal groups — such as the output signals from multiple read head video tape playback systems, for example.

A further object is to provide a highly stable large deviation wide bandwidth phase modulator for producing an output signal which varies in frequency precisely in accordance with control signals applied thereto.

Briefly, according to one embodiment of the subject invention, two intermediate frequency dispersive surface wave delay lines are used in combination with frequency translation devices to produce a wide bandwidth electronically controllable time delay circuit (or phase modulator) having a large time delay control range. The first dispersive delay line encodes the input data about a carrier frequency selected by means of a voltage controllable frequency translator circuit; with the selected carrier frequency determining the mean time delay value. The dispersive delay imposed upon the signals by the first dispersive delay line is converted to flat delay by the second dispersive delay line. Variable, flat time delay may be accomplished by either using two cascaded dispersive delay lines of the same time delay versus frequency slope with a spectrum inverter disposed between the delay lines; or by using dispersive delay lines of opposite time delay versus frequency slopes, and a frequency translation device disposed between the two delay lines. In certain embodiments of the invention dispersive coding about a carrier frequency, selected for the desired time delay, is obtained in the first dispersive delay line and the output therefrom is applied through a frequency translation device such that time compression may be accomplished in the second dispersive delay line operating about a fixed frequency value. This mechanization allows for amplitude weighting as a function of frequency to be readily implemented in the second dispersive delay line, allowing the generation of vestigal single sideband waveforms.

Other significant aspects of the invention relate to the incorporation of an electronically controllable time delay device in a feedback control loop arrangement for reducing the time jitter between groups of signals — such as those produced by video playback system for example. An additional aspect of the invention involves the use of the electronically variable time delay device in a highly stable large deviation phase modulator configuration for producing an output signal which varies in frequency precisely in accordance with programming signals applied to the variable time delay device.

BRIEF DESCRIPTION OF THE DRAWINGS

The novel features of this invention as well as the invention itself will be better understood from the accompanying description taken in connection with the accompanying drawings, in which like reference characters refer to like parts and in which:

FIG. 8*b* is a graph of voltage amplitude versus time for explaining the operation of the phase modulator of FIG. 8*a.

DESCRIPTION OF THE PREFERRED EMBODIMENTS

Figure 1A:
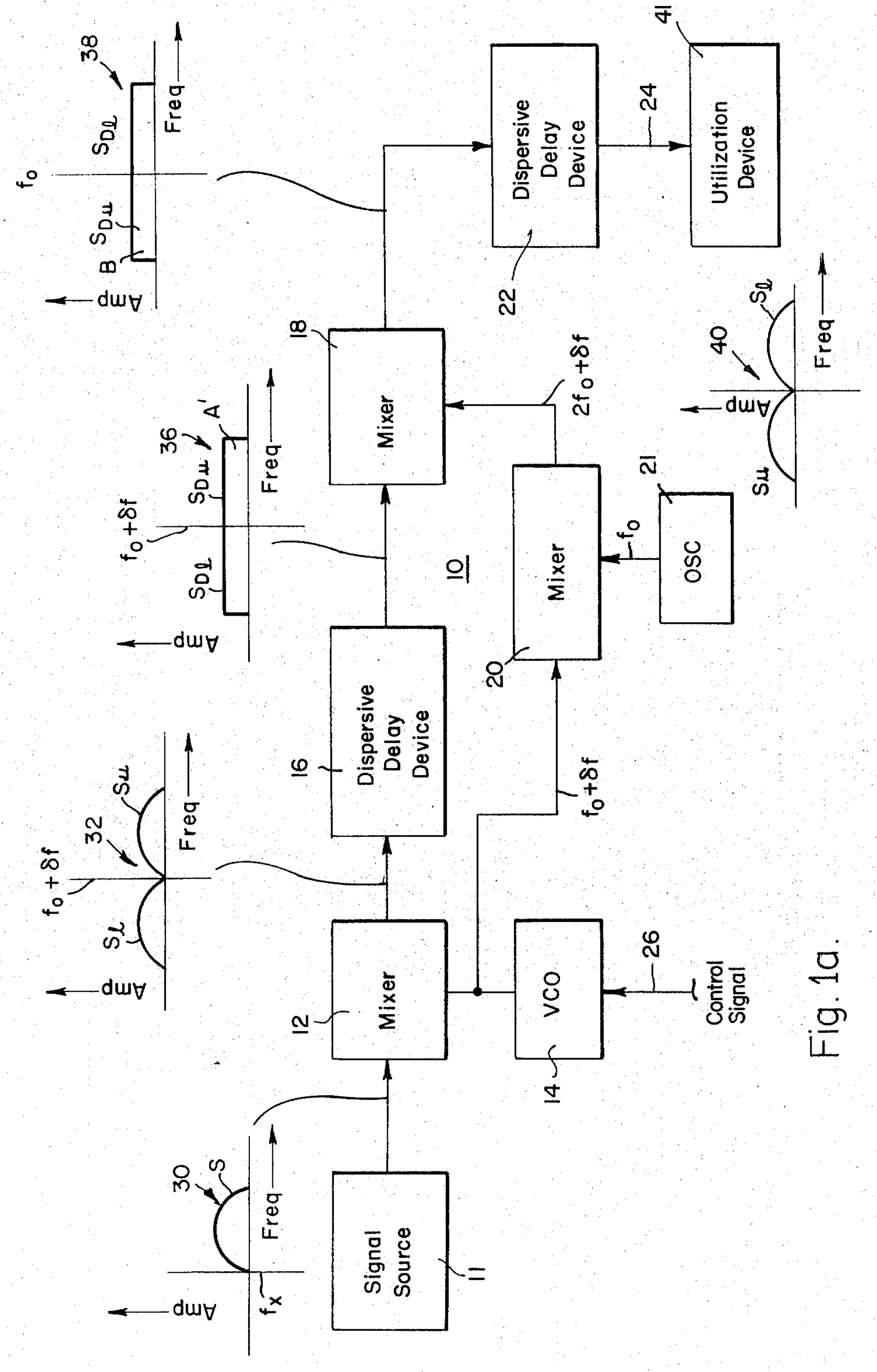
FIG. 1*a* is a block diagram of one preferred embodiment of an electronically controllable time delay device in accordance with the invention.

Reference is first primarily directed to FIG. 1*a* which shows one preferred embodiment of a variable time delay device in accordance with the subject invention. As there shown, a source 11 of broad bandwidth signals having a preselected base band (carrier) frequency $f_x$, is coupled to one input of a mixer 12. The other input of mixer 12 is supplied from a voltage controlled oscillator 14, and the output signal from mixer 12 is applied to a bandpass dispersive delay device 16. Dispersive delay devices apply differential values of time delay to signals of different frequencies. The output signals of delay device 16, appropriately shaped for single or double sideband transmission, is applied to one input of a mixer 18; and the other input signal thereto is supplied from a reference mixer 20. The output signal from mixer 18, at a frequency related to the difference in frequency between the input signals is applied through a second dispersive device 22 to an output lead 24. As will be explained subsequently, device 22 operates to time compress the previously dispersed applied signals.

The operation of the variable time delay device of FIG. 1*a* (indicated generally by reference numeral 10) may be better understood by reference to the waveforms shown in FIG. 1*a*. Waveform 30 illustrates the power amplitude versus frequency spectrum of the output signal from source 11. In order to simplify the explanation, this signal spectrum is considered to be referenced to a zero base band frequency ($f_x$) — i.e., a wideband video signal referenced to DC. The frequency of the output signal from voltage controlled oscillator (VCO) 14 is determined by a control signal applied to input terminal 26 thereof. The output frequency of voltage controlled oscillator 14 is designated $f_o + \delta f$, where $f_o$ may be considered the output frequency of the oscillator when the control signal is at a mean value; and $\delta f$ may be considered the deviation (positive or negative) from the mean value. The output signal from mixer 12 is shown in waveform 32 as having a carrier at $f_o + \delta f$ with upper and lower sidebands designated $S_u$ and $S_l$ respectively.

Figure 1B:
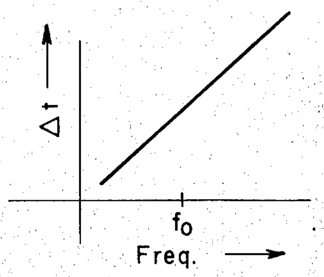
FIGS. 1*b* and 1*c* are graphs of time delay versus frequency and gain versus frequency characteristics, respectively, of dispersive delay devices of FIG. 1*a;*

Dispersive delay 16 may have a linear time delay versus frequency transfer function such as shown in FIG. 1*b*, with flat or shaped amplitude transmission characteristics. The center frequency of the operating range of device 16 may be selected to coincide with the mean frequency ($f_o$) of voltage control oscillator 14, such as 112 Mhz, for example. The central operating frequency and bandwidth of delay device 16 are selected to cover the desired time delay range; and therefore the corresponding frequency range.

The output signal from dispersive delay device 16 is shown in waveform 36 as having a generally rectangularly shaped amplitude versus frequency spectrum. However, the shape of the signal spectrum has been selected merely for illustrative purposes to indicate that the spectrum is changed by being processed through dispersive delay device 16.

The output signal spectrum from mixer 18 is depicted in a waveform 38 on FIG. 1*a;* and it is important to note that the mixer 18 not only translates the carrier frequency of the applied data signal from ($f_o + \delta f$) to $f_o$, but that the spectrum is inverted. The term "spectrum inversion" as used herein indicates that the position of the sidebands are reversed relative to the carrier, and that the spectral position of energy within each sideband is also reversed. For example, the signal at frequency B is waveform 38 was derived from energy at frequency A' in waveform 36. The second input signal to mixer 18 is supplied from mixer 20 at a frequency $2f_o + \delta f$. Signals at frequencies $f_o + \delta f$ and $f_o$ are supplied to mixer 20 from VCO 14 and reference oscillator 21, respectively.

In the embodiment of FIG. 1*a*, dispersive delay device 22 (functional used to time compress previously dispersed signals) has the same time delay versus frequency characteristics, i.e., the same slope as delay device 16 (see FIG. 1*b*). Time compression is achieved within device 22 due to the spectrum inversion provided by mixer 18. The term time compression as used herein implies that the necessary time delay as a function of frequency is impressed upon a time dispersion signal spectrum to reproduce the original signal spectrum.

The spectrum of the output signal from dispersive delay device 22 is shown in waveform 40. Comparing the signal applied from source 11 to that produced at the output of delay device 22, it may be seen that the original spectrum is translated up to the carrier frequency $f_o$ and is duplicated in each one of a pair of spectral sidebands. Utilization device 41 may include circuits for translating the frequency of the output signal to vestigial desired portion of the frequency domain; as well as eliminating a selected one of the sidebands, if desired (vestigial sideband transmission).

Figure 1C:
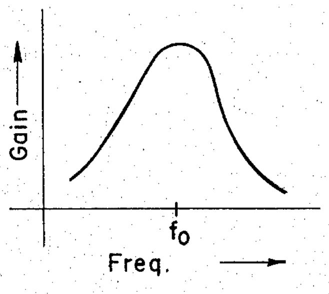

In the embodiment of FIG. 1a, the bandwidth of device 22 need not be as large as that of device 16 because the signals processed through delay device 22 are centered about a fixed carrier frequency ($f_o$). For example, the bandwidth of device 22 may be smaller than that of device 16 by an amount equal to the $\pm\delta f$ range of VCO 14 for double sideband operation, or less one sideband for vistigial sideband operation. Another advantage of the above described constant frequency implementation for dispersive delay device 22 is that amplitude weighting as a function of frequency may be readily implemented. For example, the transmission gain (less than one) of device 22 could have the Gaussian shaped characteristics shown in FIG. 1*c*. In certain applications amplitude weighting is required to reduce spectral sidelobes, which may at least in part be induced by the dispersion and compression processing.

To summarize, in the embodiment of FIG. 1a the variable time delay, i.e., the variable transit time through device 10, is predicated on dispersive coding, at an operating frequency selected for the desired delay, in a first dispersive delay line; followed by spectrum inversion, and time compression in a second dispersive delay line having the same time delay versus frequency slope as the first delay line. The second line may be operated at a fixed carrier frequency for ease in implementing amplitude weighting or vestigial sideband operation.

A second embodiment of an electronically variable time delay device is shown in FIG. *2a*. Since the structure and operation of the device of FIG. *2a* is similar to that of FIG. *1a* only the differences between the two embodiments will be discussed. In FIG. *2a* corresponding parts are designated by the same reference numeral as used in FIG. *1a*, except that a change in the structure or function of a part in FIG. *2a* is indicated by adding a prime superscript to the reference number. For example, in FIG. *2a* the output section of mixer 20' is mechanized to pass the difference frequency $\delta f$, resulting from the mixing of the two input signals $f_o + \delta f$ and $f_o$. As a result of this mechanization of mixer 20', spectrum inversion is not performed within mixer 18' (see waveform 36 and 38'). Time compression of the output signals from mixer 18' is accomplished within dispersive delay line 22', which has a time delay versus frequency slope equal to the negative of the slope device 16. FIGS. *1b* and *2b* depicts the time delay versus frequency characteristics of delay device 16 and 22', respectively.

Figure 2B:
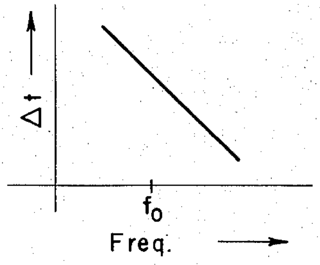
FIG. 2*b* is a graph of time delay versus frequency characteristics of one of the dispersive delay devices of FIG. 2*a;*
Figure 2A:
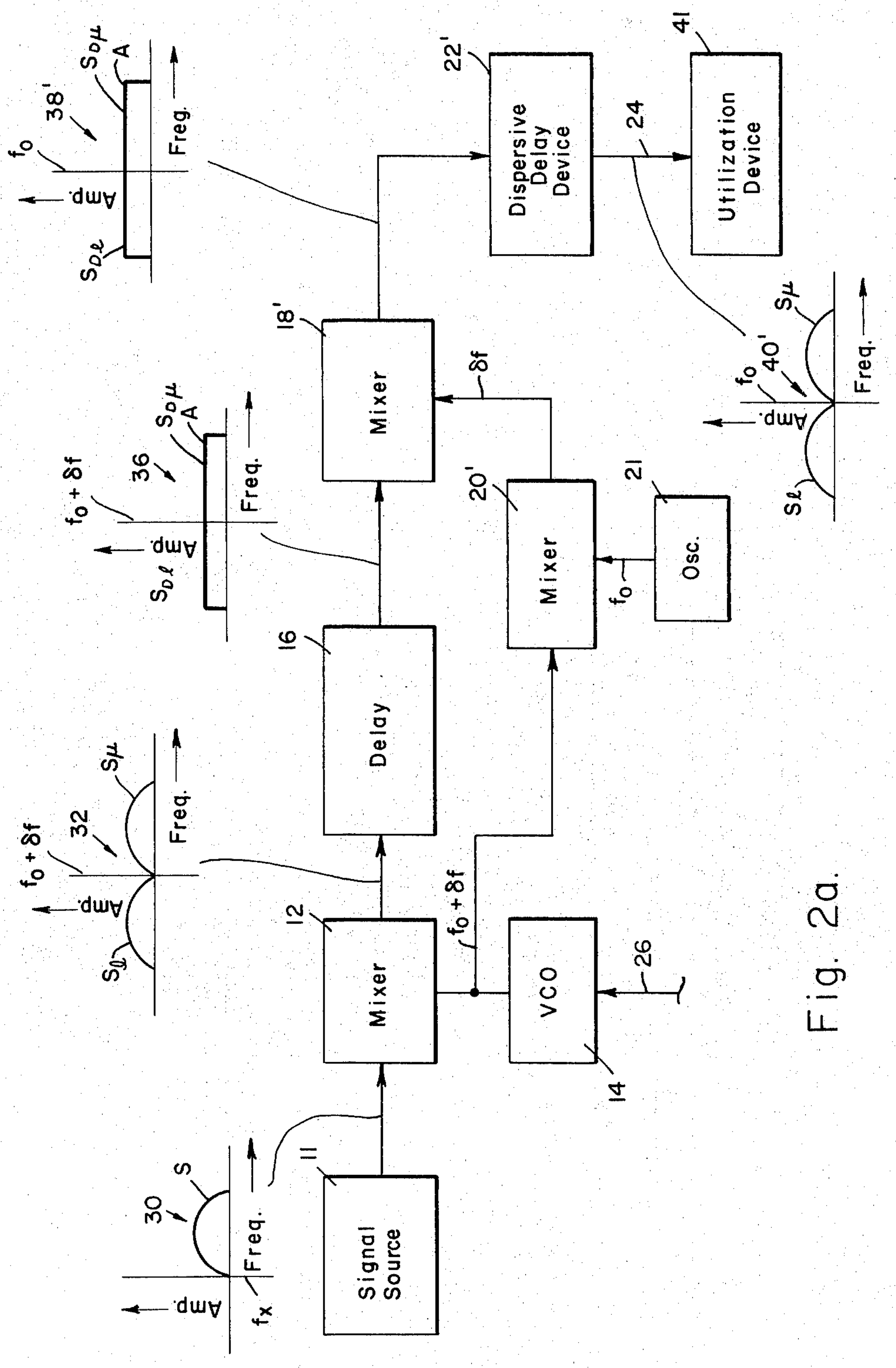
FIG. 2*a* is a block diagram of another preferred embodiment of an electronically controllable time delay device in accordance with the invention.

In the embodiment of FIG. *2a*, mixer 18' performs frequency translation so that the output signals therefrom are always referenced to a preselected carrier frequency, e.g., $f_o$. As in the embodiment of FIG. 1a, this constant frequency operation of delay device 22' (FIG. 2) allows amplitude weighting to be readily implemented. However, in the embodiment of FIG. *2a* it is necessary that the carrier frequency of the signal be changed (i.e. frequency translation be performed) to allow for the electronic control of the time delay therethrough; whereas this is not required for the embodiment of FIG. *1a*.

Figures 3, 3A, 3B, 3C, 3D:
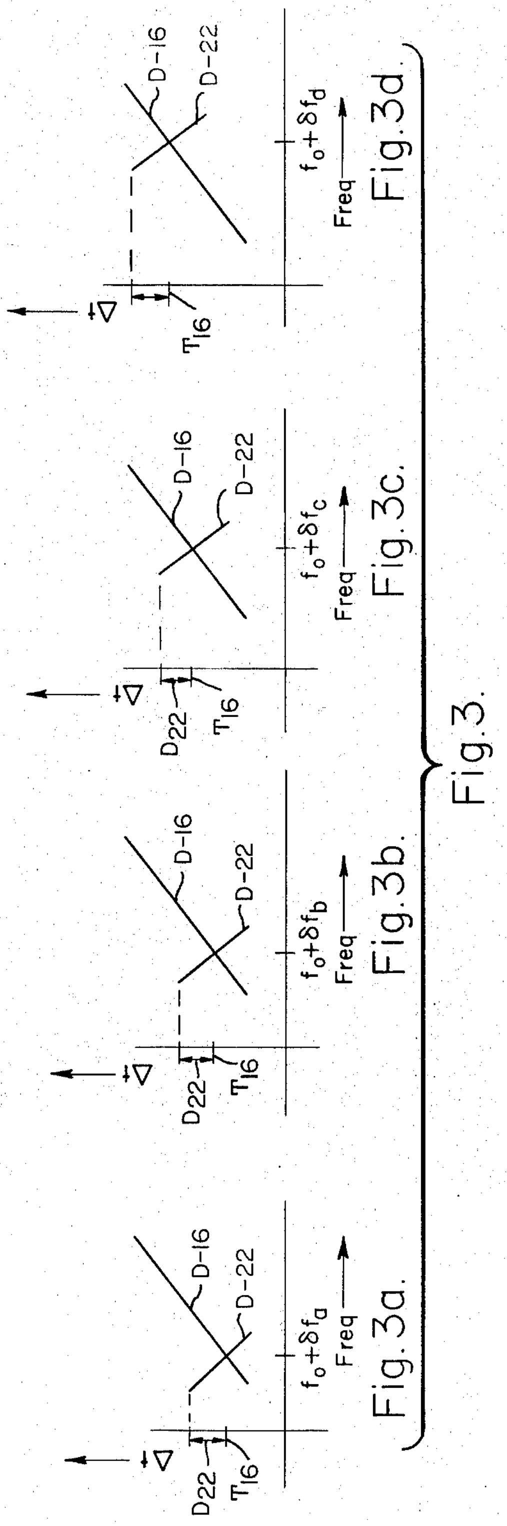
FIG. 3 depicts the relative time delay versus frequency characteristics of different sections of the device of FIGS. 1*a* and 2*a*, for explaining the operation thereof.

FIG. *3a* through *3d* illustrates the operation of the devices of FIGS. *1a* and *2a* for the cases of four progressively higher carrier frequencies applied from mixer 12. As illustrated in FIG. 3, the time delay $T_{16}$ associated with the delay characteristics designated D-16, varies with the selected carrier frequency $f_o + \delta f$; while the delay I22 associated with delay characteristics designated D-22, is constant. The delay characteristic designated D-16 corresponds to that imposed by the input section which included delay device 16; and the delay characteristic designated D-22 corresponds to that imposed by the output section which includes delay device 22.

Also, it may be noted from FIG. 3 that not only may the time delay through the first delay device (16) be selectively varied as a function of the input carrier frequency, but the effective operating bandwidth of the device may also be controlled by selection of the input carrier frequency. For example, in FIG. 3 the operating bandwidth above the input carrier frequency in FIG. *3d* is much less than in FIG. *3a*. To phrase this last point in a slightly different manner, the value $\delta f$ determines where, within the operating range of the first dispersive delay device, the frequency dispersion takes place.

Dispersive delay devices suitable for elements 16 and 22 include dispersive surface wave delay lines. For example, in accordance with the invention, variable time delay devices capable of providing a controllable time delay of up to 50 microseconds have been implemented using dispersive surface wave delay lines operating at a mean center frequency of 112 Mhz with a bandwidth of 40 Mhz. Other embodiments of the invention using dispersive surface wave delay lines have been constructed for operating at 60 Mhz with a 20 Mhz bandwidth and they provide a variable time delay of up to 50 microseconds. The operation and construction of surface wave delay devices have been described in numerous articles such as:

"Surface Wave Device Applications and Component Developments," IEEE Journal of Solid-State Circuits, Vol. SC-5, December, 1970, by J. Burnsweig, E. H. Gregory, and R. J. Wagner;

"Surface Wave Dispersion With a Time Bandwidth of 1000," 1971 IEEE Solid State Circuits Conference, February 18, Philadelphia, Pa., by J. Burnsweig and S. Arneson;

"Surface Wave Filters," 1971 IEEE Conference on Systems, Networks and Computers, Jan. 21, 1971, Oaxtepec, Mexico, by J. Burnsweig, and S. Arneson;

"Surface Wave Device Applications and Component Developments," 1970 IEEE Solid State Circuits Conference, February 19, Philadelphia, Pa., by J. Burnsweig, E. H. Gregory and R. J. Wagner; and "Direct Piezoelectric Coupling to Surface Elastic Waves," Appl. Phy. Letters, Vol. 7, pp.314–316, December, 1965, by R. M. White and F. W. Voltmer.

Figure 4:
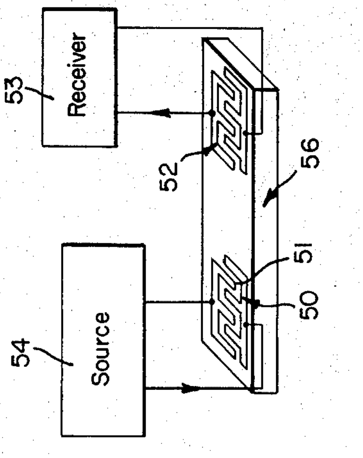
FIG. 4 is a top plan view of a dispersive surface wave delay line which may be used in the devices of FIGS. 1*a* and 2*a*.

Also a simplified sketch of a surface wave delay line is shown in FIG. 4 for the purpose of briefly summarizing the operation of such devices. Referring momentarily to FIG. 4, the surface wave delay device thereshown comprises deposited metal film, interdigital comb structures, photoetched onto a piezoelectric substrate 56. These interdigital structures form input and output transducers 50 and 52 respectively; and input transducer 50 is energized by a signal source 54. The input interdigital electrodes 51 have one-half wave length centers for some selected frequency and produce an elastic wave in the surface of the substrate material in response to the voltages from source 54; i.e., the electrodes produce fields which strain the material to cause the generation of a propagating elastic wave. The elastic wave produces electrical voltages in the interdigital structure of output transducer 52 thereby recreating at receiver 53 a delayed replica of the electrical signal applied to the input transducer. For wide bandwidth operation of the delay device, a great many interdigital finger grouping are used with each grouping being tuned to a particular portion of the applicable frequency spectrum. The dispersive effect is obtained by the different spacings between input and output transducer sections tuned to the different portions of the spectrum. For example, if the spacing between corresponding input and output transducer sections varies linearly as a function of frequency, linear frequency dispersion is provided. Also a fixed mean value of time delay is provided by the spacing on the substrate between the central portion of the input and output transducer assemblies.

A significant aspect of the subject invention relates to the removal of video distortions, such as those associated with the processing of color television (TV) programs and the like. For example, the recording and playback of TV data from multiple tape heads induces line to line time jitter, intra line distortion and field to field time base variations. Also, it is realized that the quality of TV pictures produced from recorded data, may be improved if one field of the recorded data is repeated a plurality of successive playback frames. One method for implementing this iteration process is to use data read by each of a plurality of displaced read heads. In this processing technique switching circuits apply the data from the respective read heads to the output circuits in a preselected sequence so that each record data frame is played back a desired number of times. However, it has been found that the time base jitter and signal distortion resulting from such tape playback exceeds the processing capability of conventional T receivers. It is one of the objects of the subject invention to provide a universal time based error adapter unit suitable for reducing the signal distortion to values within the capability of conventional TV receivers. It is noted that the applicability of the time and phase reference correction provided by the subject invention are not restricted to those induced by the just described playback techniques. For example, the invention is equally applicable to the reduction of distortions related to the electromechanical interface of the recording heads with the tape, servo devices irregularities; and more conventional TV signal processing steps, such as station to station transmission via relay satellites, etc.

Figure 5:
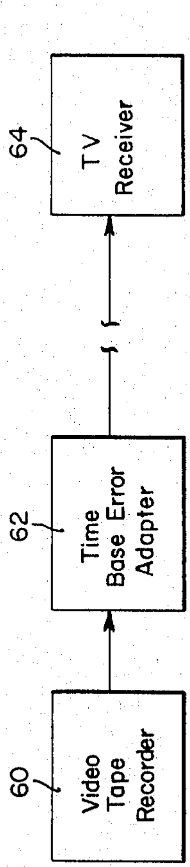
FIG. 5 is a block diagram of a video tape playback-television system incorporating a time base adapter unit in accordance with the invention.

FIG. 5 illustrates in block diagram form the overall concept of integrating a time base error adapter unit with magnetic or other electronic type recorder-playback devices so as to readjust the time and phase relationship of signals provided to a TV receiver. As shown in FIG. 5, the composite TV video or IF signal is applied from a video tape recorder-playback unit 60 to time base error adapter 62, wherein the time reference and color coding reference signals are readjusted to reduce distortions. The time and phase corrected output signal from adapter unit 62 is applied (by transmission or suitable leads) to TV receiver 64. The reduction in signal distortion within adapter unit 62 makes possible the above discussed iteration on the TV display of repetitive data fields (overlay), without blurring or line to line tearing due to time base errors associated with multiple read heads and/or other processing techniques.

Figure 6:
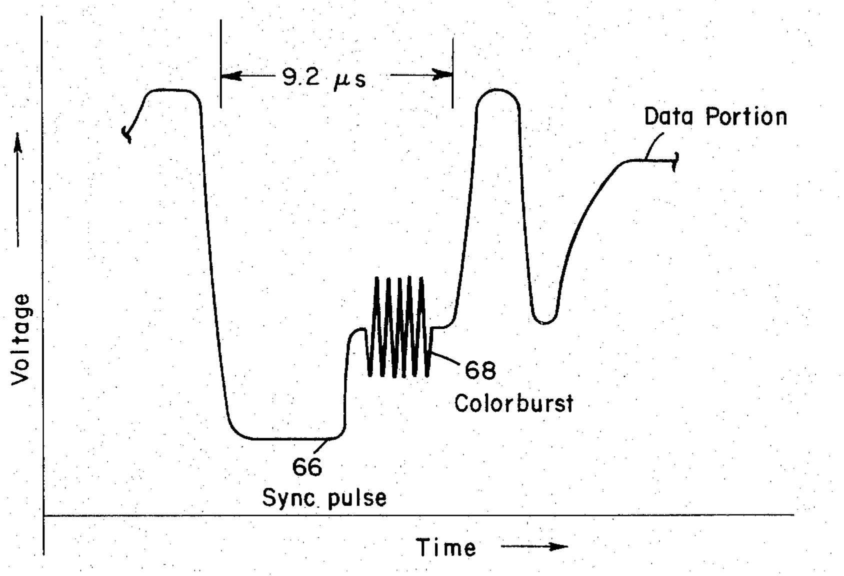
FIG. 6 is a waveform of a portion of a color television signal for explaining the purpose and function of the adapter unit.

A better understanding of time base error adapter 62 may be obtained by briefly examining the waveform of FIG. 6 which illustrates a portion of one horizontal line of color TV data. For a quality color TV picture, it is necessary that not only the timing between horizontal sync pulses 66 be maintained within predescribed limits, but that the phase as well as the frequency coherency of color burst signals 68 be maintained.

Tape recorders using the above-described multiple read head technique for picture iteration can have in excess of 0.25 microseconds of line-to-line time jitter due to head switching and due to the normal processing of data for storage on magnetic tape; and this amount of jitter exceeds the capability of conventional television receivers. For example, the automatic control characteristics of horizontal synchronizing circuits of conventional receivers are inadequate to operate with step changes of 0.25 microseconds of time jitter between heads without "horizontal line tearing." The time base error adapter unit 64 (FIG. 5) can reduce this time jitter between heads by an order of magnitude (to about 0.025 microseconds or 25 nanoseconds, for example) using a course error correction circuit operating as a function of the time separation between successive horizontal sync pulses. Additionally, the adapter may include fine error correction circuits which operate as a function of the phase coherency of successive horizontal color burst signals (reference frequency pulses) to reduce the time jitter by an additional order of magnitude, such as to a few nonoseconds, for example.

Figure 7:
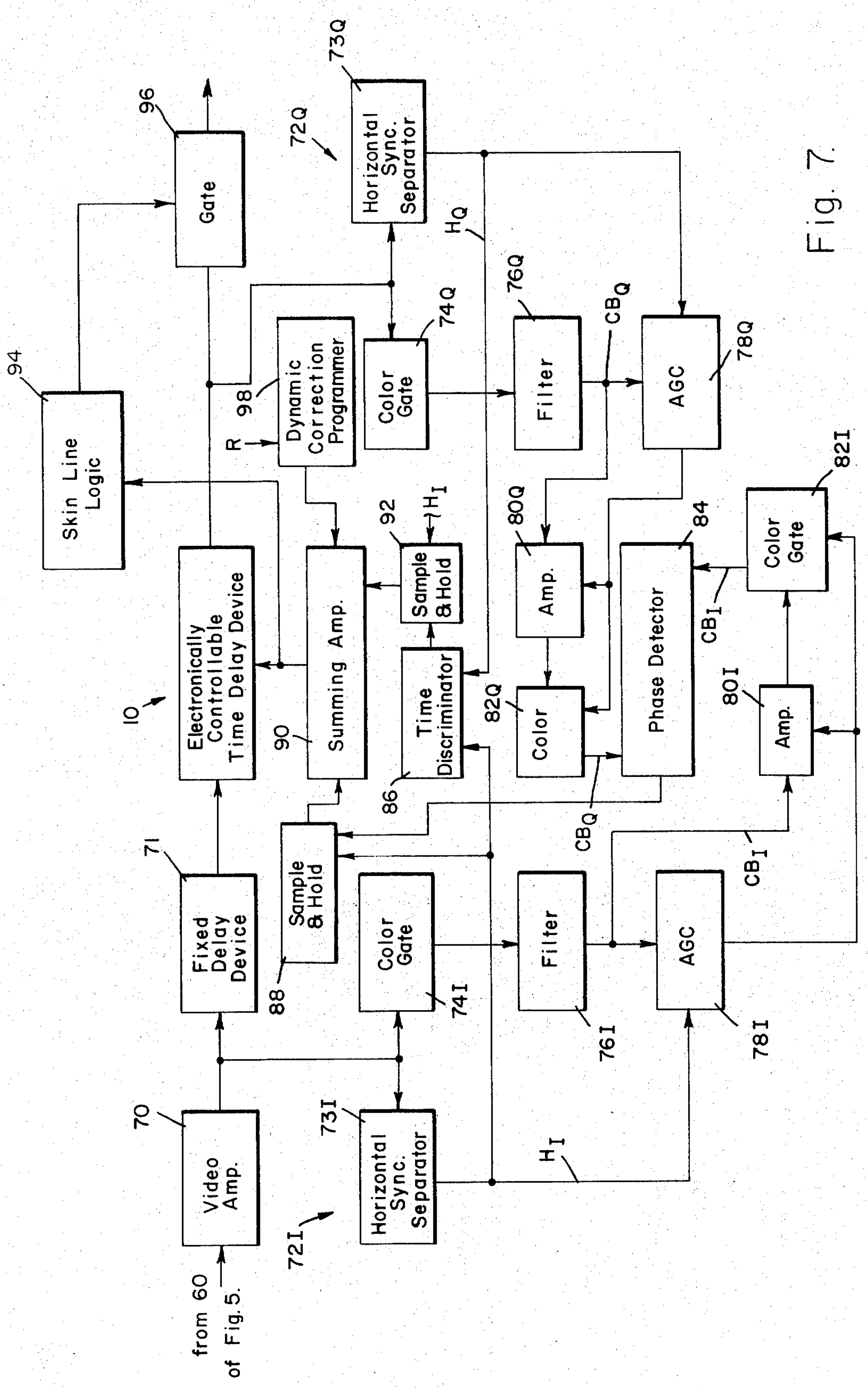
FIG. 7 is a block diagram of one preferred embodiment of a time base adapter unit.

FIG. 7 is a block diagram of one preferred embodiment of the time base error adapter 62 of FIG. 5. Briefly, in the operation of unit 62 a control signal is applied to lead 26 of the variable time delay device 10 so as to adjust the delay through unit 10 as a function of the time variations between successive horizontal sync pulses to provide a course correction for time jitter in the applied video. Fine correction is provided by a comparison of the relative phase of the color burst signals (see 68 of FIG. 6) associated with successive horizontal lines.

In the circuit of FIG. 7, the TV type signals from tape recorder unit 60 (FIG. 5) are applied to an input video amplifier 70. The output signal from video amplifier 70 is applied through a fixed delay device 71 to the variable time delay device 10. The output signals from amplifier 70 are also applied to an input processing section indicated generally by reference numeral 72I. The mean value of the time delay of variable time delay device 10 is selected such that the total delay through units 71 and 10 is approximately equal to the time between successive horizontal sync pulses of the TV signals. Delay unit 71 will be discussed further subsequent but for now it may be assumed that the delay thereof is approximately 1 microseconds, and therefore the means value of delay through device 10 is approximately 63 microseconds, for example. The output signal from variable time delay device 10 is applied to an output processing section indicated generally by the reference numeral 72Q.

Section 72I includes horizontal sync separator unit 73I, color gate circuit 74I, filter 76I, automatic gain control (AGC) unit 78I, amplifier 80I and color gate circuit 82I. Horizontal sync separator 73I operates to remove the horizontal sync pulses from the composite TV signal applied from the output terminals of amplifier 70; and color gate 74I and automatic gain control unit 78I are synchronized by the horizontal sync pulses so that they will be enabled during the color burst time period (see FIG. 6). Hence gate 74I as well as the input gates of AGC circuit 76I are synchronized by the leading edge of the horizontal sync pulses so that the color burst signal is processed through these units. The color burst signal, designated $CB_I$, from gate 74I is applied through bandpass filter 76I to signal input terminals of amplifier 80I and AGC unit 78I. The gain of amplifier 80I is controlled by the output signal from the AGC unit 78I such that the color burst signal at the output of amplifier 80I is maintained at a relatively constant amplitude. Color gate 82I, gates the signal applied thereto from amplifier 80I to one input terminal of a phase detector unit 84 only if the color burst signal exceeds a preselected value as determined by the output signal from AGC unit 78I. It is noted that gate 82I acts as a color "killer" circuit to inhibit signals to the phase detector 84 during horizontal lines in which the color burst signal is missing, such as during black and white programming, for example.

The structure and operation of output section 72Q is similar to that of the input section 72I described above; and units of section 72Q are designated by the same reference numeral used for corresponding units of section 72I except that the numeral is followed by the identifying letter Q. It is noted that the individual units comprising input sections 72I and 72Q may be conventional circuits of the type found in color television receivers.

Still referring primarily to FIG. 7, the output pulses from sync separators 73I and 73Q are compared in a time discriminator unit 86, to produce an output voltage indicative of the degree of time coincidence therebetween. The horizontal sync pulses from unit 73I are designated $H_I$ and the horizontal sync pulses supplied by unit 72Q are designated $H_Q$. Sample and hold circuits 92 is controlled by the $H_I$ signal and is mechanized such that the value of the output signal from time discriminator 86 is sampled and stored at some time $T_X$ following the leading edge of the $H_I$ signal. Time $T_X$ is the time required for time discriminator circuits 86 to stabilize within preselected limits, and it may be established at a time within the last 50 per cent of the horizontal sync pulses, for example.

The output signal from sample and hold circuit 92 is applied to a first input circuit of a summing amplifier 90. The signal produced by time discriminator 86 may be considered the course time jitter correction signal discussed hereinabove.

The phase detector 84 compares the relative phase of the color burst signals applied thereto from input section 72I and output section 72Q. The output signal from phase detector 84 is indicative of the phase coherency between the signals $CB_I$ and $CB_Q$. The color burst signal (see FIG. 6) may include about nine cycles of a 3.56 Mhz carrier. Sample and hold circuit 88 characteristics synchronized by the leading edge of the $H_I$ signal and mechanized so that the value of the output circuit of the phase detector 84 is sampled and held at some time period $I_Y$ following the leading edge of the $H_I$ pulse. The time value $T_Y$ may be selected at a value which allows the output signal from the phase detector to have stabilized within preselected limits. For example, it may be established at a time corresponding to the last 50 per cent of the color burst pulse.

The output signal from sample and hold circuit 92 is applied to a second input circuit of summing amplifier 90, and the output signal from amplifier 90 is applied to input terminal 26 of variable time delay device 10. In response to this control signal from amplifier 90, device 10 varies its time delay so as to substantially reduce the time jitter in the signals processed therethrough.

The output error signal from amplifier 90 is also applied to a skip line logic circuit 94. Logic circuit 94 includes a threshold device for sensing when the value of the error signal exceeds a preselected value and for controlling gate 96 so that the gate is opened (signal flow interrupted) for the horizontal line data period following the time the threshold is exceeded. The purpose of skip line logic circuit 94 and gate 96 is to interrupt the TV signal for horizontal data lines during which the required value of correction exceeds the capability of the adapter unit of FIG. 7.

In addition to the time jitter of the type that varies more or less as a step function from one horizontal line to the next, there can be encountered cyclic type distortion such as produced by the rotation of a conical scan tape read head, for example. A significant aspect of the subject invention is its ability to reduce this type of distortion by programming, as a function of the characteristics of each cyclic error source, a correction voltage which is applied to variable time delay device 10. In FIG. 7 such a device is the dynamic correction programmer 98 which applies a time varying voltage to a third input terminal of summing amplifier 98 in accordance with a correction program for the dynamic distortion. For example, if unit 98 were to correct for cyclic errors introduced by each one of a plurality of tape read heads, then read control signals from tape unit 60 (FIG. 5) would be applied to the dynamic correction programmer unit 98 so that a voltage generator for each of the heads could be synchronized with the signals that control the coupling of the various read heads to the output of the video tape recorder unit 60. The synchronizing signals, indicated by R in FIG. 7 could be digitally coded pulses which identify the start of the readout from a particular head; and in response to this information the programmer 98 would apply a correction voltage to summing amplifier 98 according to a stored program. The correction voltage compensates for phase errors which are peculiar to the particular read head and which vary as a function of time, i.e., as a function of the position of the read head in its conical scan pattern, for example.

To summarize, it is sometimes desirable to process the television data so as to reduce the bandwidth required to store the data on magnetic tape; or to use techniques whereby the data from a particular picture frame is played back by a plurality of switchable read heads in such a manner that the same picture frame is successively displayed a plurality of times on the TV set. However, this type of processing introduces time jitter and/or signal distortion which exceeds the processing capability of conventional television receivers. Therefore it is desirable to provide a time base error adapter unit which may be coupled to the output of a commercial video tape recorder to reduce time jitter and signal distortion to values within the capability of conventional television sets. Hence, a relatively inexpensive video tape recorder/playback unit may be made compatible with conventional television sets without the need for modification to the television receiver itself.

The time base error adapter circuit shown in FIG. 7 allows effective reduction in time jitter by techniques wherein the time of horizontal sync pulses of two consecutive horizontal data lines are compared for coarse error monitoring and correction; and fine error correction is provided by phase monitoring the color burst signals of two consecutive horizontal data lines. Also means are provided for monitoring the value of the time jitter between successive horizontal data lines and for eliminating a horizontal line when the jitter value exceeds a preselected limit. When a horizontal line of data is blanked the resulting white (unmodulated) line on the television display is preferable to an unsynchronized or distorted presentation, as would be the case for large time errors without the skip lines function of unit 94 and 96. Additionally, cyclic type phase errors within a data line may be reduced by circuits for preprogramming the compensating phase corrections.

In the operation of the time base error adapter 62 of FIG. 7, the amplified TV video signal from amplifier 70 is applied to the input processing section 72I, and through delay device 71 to variable time delay unit 10. The delay value of unit 71 is such that the correction circuits will have time to sense the time error between horizontal sync pulses and between color burst signals, and to adjust the time delay of unit 10 prior to the time that the data signal is applied thereto. For example, the unit 71 may have a fixed delay of 1 microseconds for the illustrated embodiment. Within variable time delay unit 10, the signal carrier is translated upward to the frequency $f_o + \delta f$ so as to provide the time delay correction as determined by the comparison of the horizontal sync pulses and the color burst signals within time discriminator 86 and phase detector 84, respectively.

Considering now the input processing section 72I, the output signal from amplifier 70 is divided into sync and color burst signals by means of typical base clipping, gating and filtering circuits. The horizontal sync pulses produced by both input processing section 72I and output processing section 72Q are time discriminated by unit 86 to produce a voltage indicative of the value of time jitter between successive horizontal data lines. Similarly the color burst signals from input section 72I and output section 72Q are obtained by time gating, filtering and AGC processing to provide amplitude stabilized signals for phase comparison in unit 84. The coarse time error correction signal from unit 86 and the phase error correction signal from unit 84 after being sampled and held by units 92 and 88, respectively, are combined to form the major portion of the correction signal to unit 10.

Thus a television signal is delayed in unit 10 by a control feedback circuit in such a manner as to correct timing and phase distortions. Also as discussed hereinabove relative to FIGS. 1*a* and 2*a*, time delay device 10 may incorporate amplitude weighting, i.e., varying the amplitude of the signals as a function of the frequency, so that time sidelobes may be reduced. This feature is important for minimizing or reducing the double image problem "ghosts" that time sidelobes can produce in television displays.

Another significant aspect of the invention relates to the use of an electronically controllable time delay device in a highly stable phase modulator arrangement for producing an output signal which varies in frequency in accordance with applied control signals. For example, in certain radar applications it is desirable to frequency code the transmitted signal according to a predetermined pattern. In the past considerable problems have been encountered in providing a precision frequency modulated signal, such as the linear frequency modulated signal depicted in FIGS. 8*c*. Prior art systems have used IF crystal oscillators with varactor pulling circuit, to produce these frequency modulated signals. However, the simultaneous requirements of stability and linear frequency modualation have proven difficult to implement with prior art techniques; and extensive time and expense are incurred in "trimming" each circuit to the required tolerances.

Figure 8A:
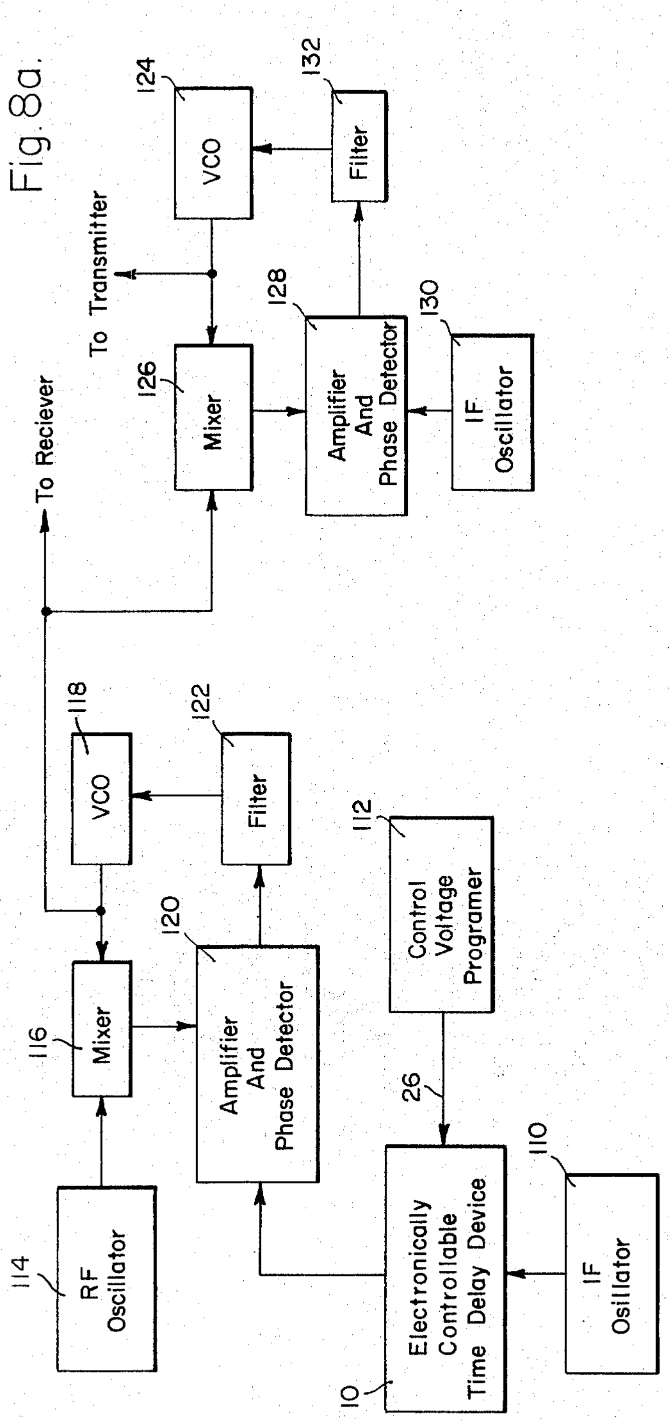
FIG. 8*a* is a block diagram of a portion of a radar system incorporating a highly stable phase modulator in accordance with the invention.

In the modulator circuit shown in FIG. 8*a* the output signal from an IF oscillator 110 is processed through electronically controllable time delay device 10; and the time delay imposed on the signals within device 10 is determined by the control voltage applied to lead 26 from a programmer unit 112. For example, the control voltage may have the characteristics depicted in FIG. 8*b;* and the time delay device 10 may be mechanized such that the delay therethrough linearly follows the format of the control voltage. The variation in the transit time through device 10 results in a frequency modulation of its output signal such as shown in FIG. 8*c*.

The output signal from an RF oscillator 114 is applied as one input signal to a mixer 116; and the output signal from voltage control oscillator 118 is applied as the output input signal to the mixer. The output signal from mixer 116 is compared to the signal from time delay device 10 in an amplifier and phase detector unit 120; and the output signal therefrom after being processed by filter unit 122, is used to control the frequency of VCO 118.

Oscillator 110 may be a crystal controlled IF oscillator; and RF oscillator 114 may be mechanized by up conversion (e.g. frequency multiplication) from a stable crystal control IF oscillator. VCO 118 may be of the varactor tuned Gunn diode type, for example.

Figure 8C:
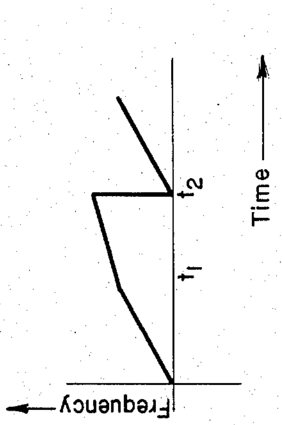
* and FIG. 8*c* is a graph of frequency versus time for explaining the operation of the phase modulator of FIG. 8*a*.
Figure 8B:
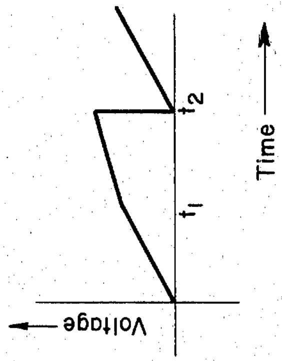

For the purpose of explaining the operation of the left portion of FIG. 8*a*, it will be assumed that a frequency modulated signal such as depicted in FIG. 8*c*, is desired in the 10 ghz (10,000 Mhz) range. The IF output signal from oscillator 110 is frequency modulated by time delay unit 10 in response to the control signal applied from programmer 112. The RF signal from oscillator 114 may be at 10 ghz, and the FM output signal from VCO 118 in the 10 ghz plus 30 Mhz range. The difference signal from mixer 116 would then be in the 30 megacycle range, and this signal is compared with the frequency modulated 30 megacycle signal supplied from time delay device 10. The output signal from amplifier and phase detector unit 120 is filtered and applied to control VCO 118 in a phase lock loop arrangement such that the output signal of VCO 118 varies in accordance with the format depicted in FIG. 8*c*.

In some radar system applications a programmable "frequency tracking" signal at a preselected frequency offset (receiver IF frequency) for use by the transmitter system is required. Such a circuit is shown in the right portion of FIG. 8*a* as including a VCO 124, which may operate in the 10 ghz range, coupled to one input circuit of a mixer 126. The output signal from VCO 118, 10 ghz plus 30 Mhz, is applied to the other input circuit of mixer 126, and the difference signal from mixer 126 is compared in amplifier and phase detector unit 128 with the output signal of an IF oscillator 130. The output signal from unit 128 is filtered in unit 132 and then used to control the output frequency of VCO 124 in a manner analogous to that described above relative to VCO 118. Hence, the output signal from VCO 124 has the same frequency modulation as the signal from VCO 118; but the signal from VCO 124 is 30 Mhz lower, for example, in frequency than the signal from VCO 118.

With the output signal from VCO 118 used as the local oscillator (LO) of a radar processor, beat notes are generated by detected targets proportional to range plus doppler offset. Doppler offset is removed by detection of the target echo with no FM ranging code. Thus the linear programmable FM signal may be used to resolve range ambiguities, for example.

While the salient features of the invention have been described with respect to particular preferred embodiments, it should be readily apparent that other modifications can be made within the spirit and the scope of the invention. For example, although the operation of the time delay devices have been explained for linear time delay versus frequency functions numerous other type delay characteristics may be used. Also in the embodiments of FIG. 1*a* and 2*a* provisions were incorporated to maintain the carrier frequency of the signals applied to the second time delay device at some selected value, so that amplitude weighting may be readily implemented; and when this feature is not required certain simplifications may be realized. For example, in FIG. 1*a* mixer 12 may be deleted and mixer 18 and the associated circuits mechanized for spectrum inversion, and frequency translation by $\delta f$. Similarly if amplitude weighting is not required in the embodiment in FIG. 2*a*, mixer 12 could be deleted and mixer 18' mechanized for frequency translation by $\delta f$.

What is claimed is:

1. A device for processing applied signals such that the transit time of the signals through the device is controllable in accordance with a control signal, said device comprising:

first delay means for time delaying signals processed therethrough in accordance with a first function of the frequency of the signals such that signals of different frequencies are delayed by different amounts;

second delay means series coupled to said first delay means, for time delaying signals processed therethrough in accordance with a second function of the frequency of the signals such that signals of different frequencies are delayed by different amounts, and with said second function being related to said first function such that signals of all frequencies are delayed substantially the same amount in transit through the combination of said first and second delay means; and first frequency translation means for frequency translating signals, prior to their been processed through at least one of said first and second delay means, as a function of said control signal, said first frequency translation means having a control circuit adapted for receiving said control signal; whereby the transit time through said device is substantially the same for all frequencies and the magnitude of the transit time is determined by the value of the control signal.

2. The device of claim 1 wherein said first frequency translation means includes a mixer; and a voltage controlled oscillator having an output circuit coupled to said mixer such that the frequency translation of the output signals from said mixer is a function of the control signal applied to an input circuit of said voltage controlled oscillator.

3. The device of claim 1 wherein at least one of said delay means includes means for amplitude weighting the signals processed therethrough as a function of frequency.

4. The device of claim 1 wherein said first frequency translation means included an input circuit coupled to receive said applied signals and an output circuit coupled to said first delay means; and further comprising second frequency translation means series coupled between said first and second delay means for controlling the frequency of signals applied to said second delay means as a function of said control signal; and wherein said first delay means includes means for delaying signals processed therethrough as a first substantially linear function of the frequencies of the signals; and said second delay means includes means for delaying signals processed therethrough as a second substantially linear function of the frequencies of the signals, with the delay versus frequency transfer function of said second delay means having a slope substantially equal to the negative of the slope of the delay versus frequency transfer function of said first delay means.

5. The device of claim 4 wherein said second frequency translation means includes means for maintaining the frequency translation of the output signals therefrom, relative to the frequency of the corresponding applied signal, at a preselected value.

6. The device of claim 5 wherein said second delay means includes means for amplitude weighting the signals applied thereto as a predetermined function of frequency.

7. The device of claim 1 wherein said first frequency translation means includes an input circuit coupled to received said applied signals and an output circuit coupled to the input of said first delay means; and further comprising spectrum inversion means coupled between said first and second delay means, for inverting the spectrum of signals applied thereto; and wherein said second delay means includes means for time delaying signals processed therethrough such that said second function is substantially the same as said first function.

8. The device of claim 7 wherein said spectrum inversion means includes means for maintaining the frequency translation of the output signals therefrom, relative to the frequency of the corresponding applied signal, at a preselected constant value.

9. The device of claim 8 wherein said first and second function are linear functions and said second delay means includes means for amplitude weighting the signals applied thereto as a predetermined function of frequency.

10. The device of claim 1 wherein said first delay means comprises a surface wave dispersive delay device having input and output transducers disposed on an acoustical propagation medium, such that the time delay through the delay device is in accordance with said first function.

11. The device of claim 10 wherein said second delay means comprises a second surface wave dispersive delay device having input and output transducers disposed on an acoustical propagation medium such that the time delay through said second delay device is in accordance with said second function.

12. A device for processing applied signals such that the transit time of the signals therethrough may be controlled in response to a control signal, said device comprising:

a first frequency translation means for frequency translating signals applied thereto as a function of the control signal;

first delay means for time delaying signals processed therethrough in accordance with a first function of the frequency of the signals;

second delay means, series coupled to said first frequency translation means and to said first delay means, for time delaying signals processed therethrough substantially in accordance with said first function of the frequency of the signals; and spectrum inversion means, series coupled between said first and second delay means for inverting the spectrum of the signals applied therethrough; whereby the transit time through said device is substantially the same for all frequencies, and the magnitude of the transit time is determined by the value of the control signal.

13. The device of claim 12 wherein said spectrum inversion means further includes means for frequency translating the signals processed therethrough as a function of said control signal such that the frequency translation of the output signals therefrom, relative to the frequency of the corresponding signal applied to said device, is maintained at a preselected value.

14. The device of claim 13 wherein at least one of said delay means includes means for amplitude weighting the signals processed therethrough as a function of frequency.

15. The device of claim 12 wherein said first and second delay means each includes a dispersive type delay having a time delay therethrough which is approximately a linear function of frequency.

16. A device for processing applied signals such that the transit time of the signals therethrough may be controlled in response to a control signal, said device comprising:

first delay means for time delaying signals processed therethrough in accordance with a first function of the frequency of said signals;

second delay means series coupled to said first delay means for time delaying the signals processed therethrough as a second function of the frequency of said signals, with said second function being related to said first function such that signals at all frequencies are delayed substantially the same amount in transit through the combination of said first and second delay means; and first frequency translation means, series coupled between said first and second delay means, for frequency translating the signals applied from said first delay means to said second delay means as a function of said control signal; whereby the transit time through said device is substantially the same for all frequencies and the magnitude of the transit time is determined by the value of the control signal.

17. The device of claim 16 further comprising second frequency translation means coupled to said first delay means for translating the frequency of the signals applied to the device as a function of the control signal; and said first frequency translating means includes means for translating the frequency of the output signals of said first delay means by a preselected amount.

18. The device of claim 17 wherein at least one of said delay means includes means for amplitude weighting the signals processed therethrough as a function of frequency.

19. The device of claim 16 wherein said first and second delay means include first and second dispersive acoustical type delay devices, respectively; with said first delay device having an approximately linear time delay versus frequency transfer function of a first slope, and said second delay line having an approximately linear time delay versus frequency transfer function with a slope equal to the negative of said first slope.

* * * * *